(12) United States Patent
Yonezawa et al.

(10) Patent No.: US 8,244,511 B2
(45) Date of Patent: Aug. 14, 2012

(54) RADIO WAVE PROPAGATION CHARACTERISTIC ESTIMATION APPARATUS AND COMPUTER PROGRAM

(75) Inventors: Kenya Yonezawa, Fujimino (JP); Takashi Inoue, Fujimino (JP)

(73) Assignee: KDDI Corporation, Tokyo (JP)

( * ) Notice: Subject to any disclaimer, the term of this patent is extended or adjusted under 35 U.S.C. 154(b) by 434 days.

(21) Appl. No.: 12/560,726

(22) Filed: Sep. 16, 2009

(65) Prior Publication Data
US 2010/0076730 A1    Mar. 25, 2010

(30) Foreign Application Priority Data
Sep. 22, 2008    (JP) ............................... P2008-242516

(51) Int. Cl.
*G06F 17/50*    (2006.01)
*G06G 7/62*    (2006.01)
(52) U.S. Cl. ........ 703/13; 455/226.1; 455/423; 455/446
(58) Field of Classification Search ................. 703/5, 13
See application file for complete search history.

(56) References Cited

U.S. PATENT DOCUMENTS

| | | | | |
|---|---|---|---|---|
| 7,634,265 | B2 * | 12/2009 | Sugahara et al. ............ | 455/423 |
| 8,160,594 | B2 * | 4/2012 | Sato et al. ..................... | 455/446 |
| 2008/0161005 | A1 * | 7/2008 | Sato et al. ..................... | 455/446 |
| 2010/0267343 | A1 * | 10/2010 | Nyu .............................. | 455/67.7 |

FOREIGN PATENT DOCUMENTS
JP    2005-318308 A    11/2005

OTHER PUBLICATIONS

Staubach et al, "Microcellular Radio-Channel Propagation Prediction", IEEE Antennas and Propagation Magazine, vol. 36, No. 4, Aug. 1994.*
Athanasiadou et al, "A Novel 3-D Indoor Ray-Tracing Propagation Model: The Path Generator and Evaluation of Narrow-Band and Wide-Band Predictions", IEEE Transactions on Vehicular Technology, vol. 49, No. 4, Jul. 2000.*
Tan et al, "A Microcellular Communications Propagation Model Based on the Uniform Theory of Diffraction and Multiple Image Theory", IEEE Transactions on Antennas and Propagation, vol. 44, No. 10, Oct. 1996.*

(Continued)

*Primary Examiner* — Mary C Jacob
(74) *Attorney, Agent, or Firm* — Morgan, Lewis & Bockius LLP

(57) ABSTRACT

A radio wave propagation characteristic estimation apparatus includes at least a ray launching method calculation unit, an imaging method calculation unit, and a synthesis unit. The ray launching method calculation unit calculates a first piece of radio wave propagation characteristic estimation data in which a radio wave propagation characteristic from a radio wave transmission point to a building with a radio wave reception point is estimated, using a plan view data. The imaging method calculation unit calculates a second piece of radio wave propagation characteristic estimation data in which a radio wave propagation characteristic from the radio wave transmission point to the building with the radio wave reception point is estimated, using the vertical cross-sectional view data. The synthesis unit calculates pieces of indoor penetration data to the radio wave reception point within the building respectively for the first piece and the second piece, and synthesizes the pieces of indoor penetration data.

6 Claims, 9 Drawing Sheets

OTHER PUBLICATIONS

Bertoni et al, "UHF Propagation Prediction for Wireless Personal Communications", Proceedings of the IEEE, vol. 82, No. 9, Sep. 1994.*

Planned and supervised by Yosio Hosoya "Radiowave Propagation Handbook", Published by Realize Inc., Part 1, Chapter 15.5, 1999.

Information and Mathematical Science Laboratory Inc., "Comparison of launching method and image method", (retrieved on Aug. 21, 2008), Internet <URL: www.imslab.co.jp/Product/eem/rtm/raytrace.htm>.

Ericcson, "Planet EV", (retrieved on Aug. 21, 2008), Internet <URL: www.ericcson.com/solutions/tems/network_plan/planetev.shtml>.

Kozo Keikaku Engineering Inc., "RapLab," http://www4.kke.co.jp/raplab/.

* cited by examiner

101; BUILDING AT TRANSMISSION POINT

SPECIFIED ZONE

102; BUILDING AT RECEPTION POINT

RADIO WAVE PROPAGATION CHARACTERISTIC ESTIMATION APPARATUS AND COMPUTER PROGRAM

BACKGROUND OF THE INVENTION

1. Field of the Invention

The present invention relates to a radio wave propagation characteristic estimation apparatus and a computer program.

Priority is claimed on Japanese Patent Application No. 2008-242516, filed Sep. 22, 2008, the content of which is incorporated herein by reference.

2. Description of Related Art

In a wireless communication system such as a mobile phone network, there are conventionally known a variety of techniques where in order to estimate a communicable region (a service area) of a given base station, a ray tracing method is used to calculate radio wave propagation characteristic estimation data (a trace of a radio wave, a propagation loss, a received signal intensity, and the like) in which a characteristic related to propagation of a radio wave launched from one base station is estimated. The ray tracing method is disclosed in, for example, Non-Patent Document 1, "Hosoya, Yoshio (Ed.), Radiowave Propagation Handbook, Part 2, Chapter 15, 15.5, 1999, Realize Science & Engineering Center Co., Ltd.".

The ray tracing method includes an imaging method and a ray launching method. The imaging method calculates a trace of reflections and diffractions of a radio wave on the mirror image principle. According to the imaging method, it is possible to correctly find a trace of a radio wave. However, with an increase in number of the reflection surfaces and the diffraction points, an amount of calculation increases exponentially. In the ray launching method, launch directions of the radio waves at a transmission point are discretely provided. Radio waves are launched in the launch directions and the traces of the radio waves are sequentially followed. According to the ray launching method, it is possible to suppress an amount of calculation more than the imaging method. However, it is difficult to take diffraction waves into consideration.

In the technique described in Patent Document 1, "Japanese Unexamined Patent Application, First Publication No. 2005-318308", the ray launching method is used to calculate a trace of a radio wave over a plurality of floors within a building. In the technique described in Non-Patent Document 2, "KOZO KEIKAKU ENGINEERING Inc., "RapLab", [searched on Aug. 21, 2008], the Internet <URL: http://www4.kke.co.jp/raplab/>", the imaging method is used to calculate a trace of a radio wave. Non-Patent Document 3, "Information and Mathematical Science Laboratory Inc., "Comparison between Launching Method and Imaging method", [searched on Aug. 21, 2008], the Internet <URL: http://www.imslab.co.jp/Product/eem/rtm/raytrace.htm>" describes a comparison between the ray launching method and the imaging method, in which is disclosed a system of calculating a propagation route with a small number of reflections by the imaging method while calculating a propagation route with a large number of reflections by the ray launching method.

As a conventional technique for estimating a received signal intensity of a radio wave from every base stations on outdoor main roads, there is known a technique disclosed in, for example, Non-Patent Document 4, "ERICSSON, "Planet EV", [searched on Aug. 21, 2008], the Internet, <URL: http://www.ericsson.com/solutions/tems/network_plan/plan-etev.shtml>".

The technique of Non-Patent Document 4 relates to an area design tool for mobile phones, in which the coverage and the influence of interference by a plurality of base stations over a wide area is estimated. Its main object is to provide a two-dimensional wireless area design. To be more specific, representative values of a building environment in the area such as an average building height and an average road width are extracted. Then, the statistical method (an estimation formula) described in Chapter 15 of Non-Patent Document 1 is used to estimate a signal intensity from every base station. The technique of Non-Patent Document 4 uses map data and the like in which a map database including building data is processed and an average height of buildings for, for example, every 25 square meters is extracted.

However, in the aforementioned conventional techniques, the ray launching method and the imaging method are not properly combined.

The conventional techniques described in Patent Document 1 and Non-Patent Document 2 uses only one of the ray launching method and the imaging method, and does not combine the ray launching method with the imaging method.

Non-Patent Document 3 discloses a system of applying the imaging method to a propagation route with a small number of reflections while applying the ray launching method to a propagation route with a large number of reflections. However, it is necessary to take the trouble to select the use of either the ray launching method or the imaging method for every propagation route based on the number of reflections. This is inefficient. In general, traces of radio waves can be found more correctly by the imaging method than by the ray launching method. However, if selection of use is made between the ray launching method and the imaging method according to the number of reflections, it follows that simply because the number of reflections is large (the number of reflections is a specified number or greater), the ray launching method is applied to a propagation route to which the imaging method is preferably applied. This is very inefficient.

For example, as shown in FIG. 9, among the propagation routes of the radio waves launched from a transmission point (a base station) at a high elevation position to roofs of the buildings in the direction of the ground, there is a propagation route that repeats reflections and diffractions from roof to roof of the buildings. In this case, it is desirable that the trace of the radio wave repeating reflections and diffractions from roof to roof of the buildings be correctly found by the imaging method in consideration of diffraction waves. However, if selection of use is made between the ray launching method and the imaging method according to the number of reflections, there is a possibility that the ray launching method is adopted, thus failing in correctly taking the diffraction waves into consideration.

Furthermore, there is known a conventional technique for estimating a radio wave characteristic from an outdoor base station (a transmission point) to an outdoor mobile station (a reception point) (for example, Non-Patent Document 4). However, a problem of estimating a radio wave propagation characteristic from an outdoor base station (a transmission point) to an indoor mobile station (a reception point) persists.

The present invention has been achieved in view of such circumstances, and has an object to provide a radio wave propagation characteristic estimation apparatus and a computer program that properly combine a ray launching method and an imaging method to thereby make it possible to efficiently generate radio wave propagation characteristic estimation data and also to estimate a radio wave propagation characteristic from an outdoor transmission point to an indoor reception point.

SUMMARY

The present invention seeks to solve one or more of the above problems, or to improve upon those problems at least in part.

In one embodiment, there is provided a radio wave propagation characteristic estimation apparatus that includes at least: an estimation unit which estimates a characteristic related to propagation of a radio wave from one radio wave transmission point to one radio wave reception point in a specified zone; a building database which has information on shapes, heights, orientations, and locations of buildings; a plan view data generation unit which generates plan view data on the buildings in the specified zone, using the information in the building database; a vertical cross-sectional view data generation unit which generates vertical cross-sectional view data being data on cross-sections of the buildings in the specified zone taken along a vertical plane comprising a line that connects the radio wave transmission point with the radio wave reception point, using the information in the building database; a ray launching method calculation unit which calculates by a ray launching method a first piece of radio wave propagation characteristic estimation data in which a radio wave propagation characteristic from the radio wave transmission point to a building with the radio wave reception point is estimated, using the plan view data; an imaging method calculation unit which calculates by an imaging method a second piece of radio wave propagation characteristic estimation data in which a radio wave propagation characteristic from the radio wave transmission point to the building with the radio wave reception point is estimated, using the vertical cross-sectional view data; and a synthesis unit which calculates pieces of indoor penetration data to the radio wave reception point within the building respectively for the first piece of radio wave propagation characteristic estimation data and the second piece of radio wave propagation characteristic estimation data, and synthesizes the pieces of indoor penetration data.

Moreover, in the radio wave propagation characteristic estimation apparatus according to the present invention, the plan view data may be data on cross-sections of the buildings in the specified zone taken along a plane that comprises a first line connecting the radio wave transmission point having a height with the radio wave reception point having a height and a horizontal second line orthogonal to the first line.

Besides, in the radio wave propagation characteristic estimation apparatus according to the present invention, a street may be registered with the building database as a 1-floor building.

In another embodiment, there is provided a computer program which causes a computer to execute at least: an estimation process which estimates a characteristic related to propagation of a radio wave from one radio wave transmission point to one radio wave reception point in a specified zone; a reading process which reads information on buildings in the specified zone from a building database which has information on shapes, heights, orientations, and locations of buildings; a plan view data generation process which generates plan view data on the buildings in the specified zone, using the information on the buildings in the specified zone; a vertical cross-sectional view data generation process which generates vertical cross-sectional view data being data on cross-sections of the buildings in the specified zone taken along a vertical plane comprising a line that connects the radio wave transmission point with the radio wave reception point, using the information on the buildings in the specified zone; a ray launching method calculation process which calculates by a ray launching method a first piece of radio wave propagation characteristic estimation data in which a radio wave propagation characteristic from the radio wave transmission point to a building with the radio wave reception point is estimated, using the plan view data; an imaging method calculation process which calculates by an imaging method a second piece of radio wave propagation characteristic estimation data in which a radio wave propagation characteristic from the radio wave transmission point to the building with the radio wave reception point is estimated, using the vertical cross-sectional view data; and a synthesis process which calculates pieces of indoor penetration data to the radio wave reception point within the building respectively for the first piece of radio wave propagation characteristic estimation data and the second piece of radio wave propagation characteristic estimation data, and synthesizes the pieces of indoor penetration data.

Moreover, in the computer program according to the present invention, the plan view data may be data on cross-sections of the buildings in the specified zone taken along a plane that comprises a first line connecting the radio wave transmission point having a height with the radio wave reception point having a height and a horizontal second line orthogonal to the first line.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder is a description of embodiments of the present invention with reference to the drawings.

Figure 1:
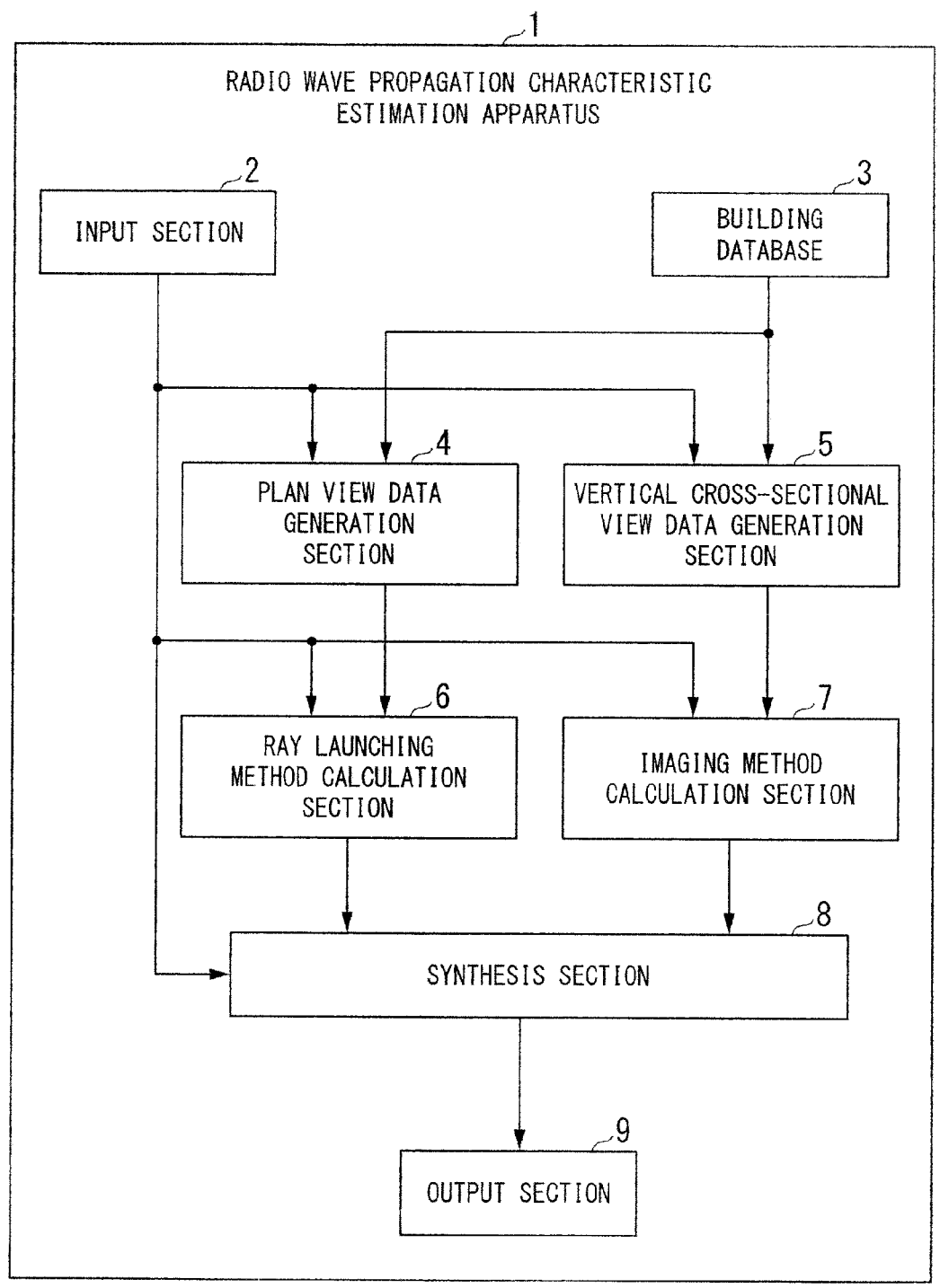
FIG. 1 is a block diagram showing a configuration of a radio wave propagation characteristic estimation apparatus 1 according to an embodiment of the present invention.

FIG. 1 is a block diagram showing a configuration of a radio wave propagation characteristic estimation apparatus 1 according to an embodiment of the present invention. In FIG. 1, the radio wave propagation characteristic estimation apparatus 1 includes: an input section 2; a building database 3; a plan view data generation section 4; a vertical cross-sectional view data generation section 5; a ray launching method calculation section 6; an imaging method calculation section 7; a synthesis section 8; and an output section 9.

The input section 2 is for the operator to specify estimation conditions of a characteristic related to propagation of a radio wave (a radio wave propagation characteristic). The operator uses the input section 2 to specify a target zone for estimating a radio wave propagation characteristic (a specified zone), a transmission point of a radio wave (a radio wave transmission point), and a reception point of a radio wave (a radio wave reception point).

The building database 3 has information on the shapes, heights, orientations, and locations of the buildings. The building database 3 is configured so as to store at least information on the buildings that really exist in the specified zone. For example, in the building database 3, information on the buildings really existing in the zone whose radio wave propagation characteristic is estimated by the radio wave propagation characteristic estimation apparatus 1 is previously included as much as possible. Alternatively, the building database 3 may be configured so as to obtain and store, according to a specified zone, information on the buildings existing in the zone from a building database provided outside the radio wave propagation characteristic estimation apparatus 1.

The plan view data generation section 4 reads information on the buildings in the specified zone from the building database 3, and uses the information on the buildings to generate plan view data. The vertical cross-sectional view data generation section 5 reads information on the buildings in the specified zone from the building database, and uses the information on the buildings to generate vertical cross-sectional view data.

The ray launching method calculation section 6 uses the plan view data to calculate a first piece of radio wave propagation characteristic estimation data in which a radio wave propagation characteristic from the radio wave transmission point to the building with the radio wave reception point is estimated by the ray launching method. The imaging method calculation section 7 uses the vertical cross-sectional view data to calculate a second piece of radio wave propagation characteristic estimation data in which a radio wave propagation characteristic from the radio wave transmission point to the building with the radio wave reception point is estimated by the imaging method.

The radio wave propagation characteristic estimation data includes a trace of a radio wave, a propagation loss, a received signal intensity.

The synthesis section 8 calculates pieces of indoor penetration data to the radio wave reception point within the building respectively for the first piece of radio wave propagation characteristic estimation data and the second piece of radio wave propagation characteristic estimation data, and synthesizes the pieces of indoor penetration data. The output section 9 outputs the resultant radio wave propagation characteristic estimation data.

The radio wave propagation characteristic estimation apparatus 1 according to the present embodiment may be implemented by dedicated hardware. Alternatively, it may be constituted by a computer system such as a personal computer, and the function thereof may be implemented by executing a program for implementing the functions of the sections of the radio wave propagation characteristic estimation apparatus 1 shown in FIG. 1.

Furthermore, it is configured such that an input apparatus, an output apparatus, and the like are connected as peripheral equipment to the radio wave propagation characteristic estimation apparatus 1. Here, the input apparatus refers to an input device such as a keyboard and a mouse, a readout apparatus that reads data from a recording medium, and the like. The output apparatuses include, for example, a display apparatus such as a CRT (Cathode Ray Tube) and a liquid crystal display apparatus, a recording apparatus for writing in a recording medium, a printing apparatus, and the like.

Furthermore, the above-mentioned peripheral equipment may be one which is directly connected to the radio wave propagation characteristic estimation apparatus 1, or one which is connected thereto via a communications line.

Figure 2:
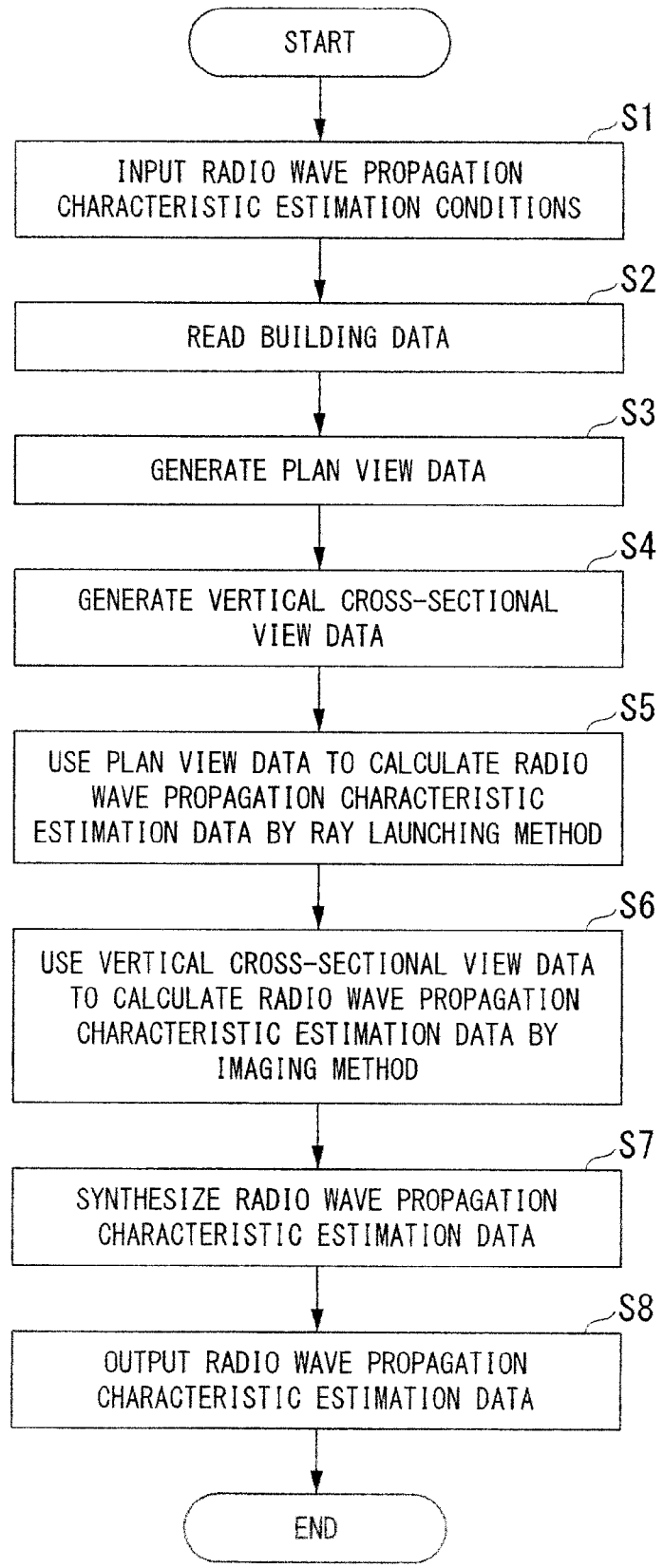
FIG. 2 is a flow chart showing a procedure of radio wave propagation characteristic estimation processing according to the embodiment of the present invention.

Next is a description of an operation of the radio wave propagation characteristic estimation apparatus 1 of the present embodiment with reference to FIG. 2.

FIG. 2 is a flow chart showing a procedure of radio wave propagation characteristic estimation processing according to the present embodiment.

First, in step S1, the operator uses the input section 2 to input radio wave propagation characteristic estimation conditions. To be more specific, the operator uses the input section 2 to specify a specified zone, a radio wave transmission point, and a radio wave reception point. A radio wave transmission point (hereinafter, referred to simply as "transmission point") has its location and height specified based on a building in the specified zone and on a height at which the transmission point is installed. A radio wave reception point (hereinafter, referred to simply as "reception point") similarly has its location and height specified based on a building in the specified zone and on a height at which the reception point is installed.

In addition, as for the reception point, it is configured such that a specification of its installation location within the building is made available. It is configured such that the heights of the transmission point and the reception point can be specified with a floor of the building (first floor, second floor, rooftop, and the like).

Figure 3:
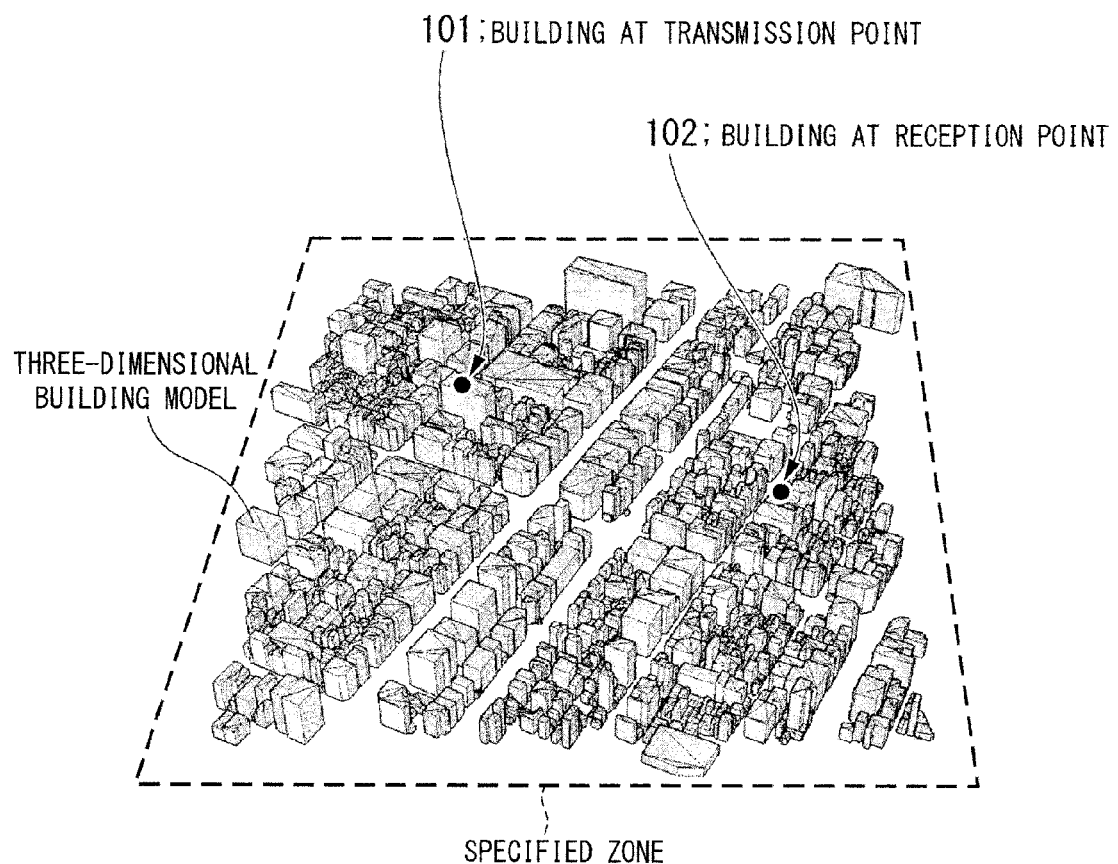
FIG. 3 is a conceptual diagram showing information on buildings in a specified zone according to the embodiment of the present invention.

Next, in step S2, the plan view data generation section 4 and the vertical cross-sectional view data generation section 5 reads the information on the building in the specified zone from the building database 3. FIG. 3 shows a conceptual diagram of information on buildings in the specified zone. As shown in FIG. 3, the information on the buildings in the specified zone (shapes, heights, orientations, and locations) represents a building layout plan in which three-dimensional building models are arranged in their respective locations. Furthermore, the building 101 with the transmission point and the building 102 with the reception point are specified.

Next, in step S3, the plan view data generation section 4 uses the information on the buildings in the specified zone to generate plan view data on the buildings in the specified zone.

Figure 4:
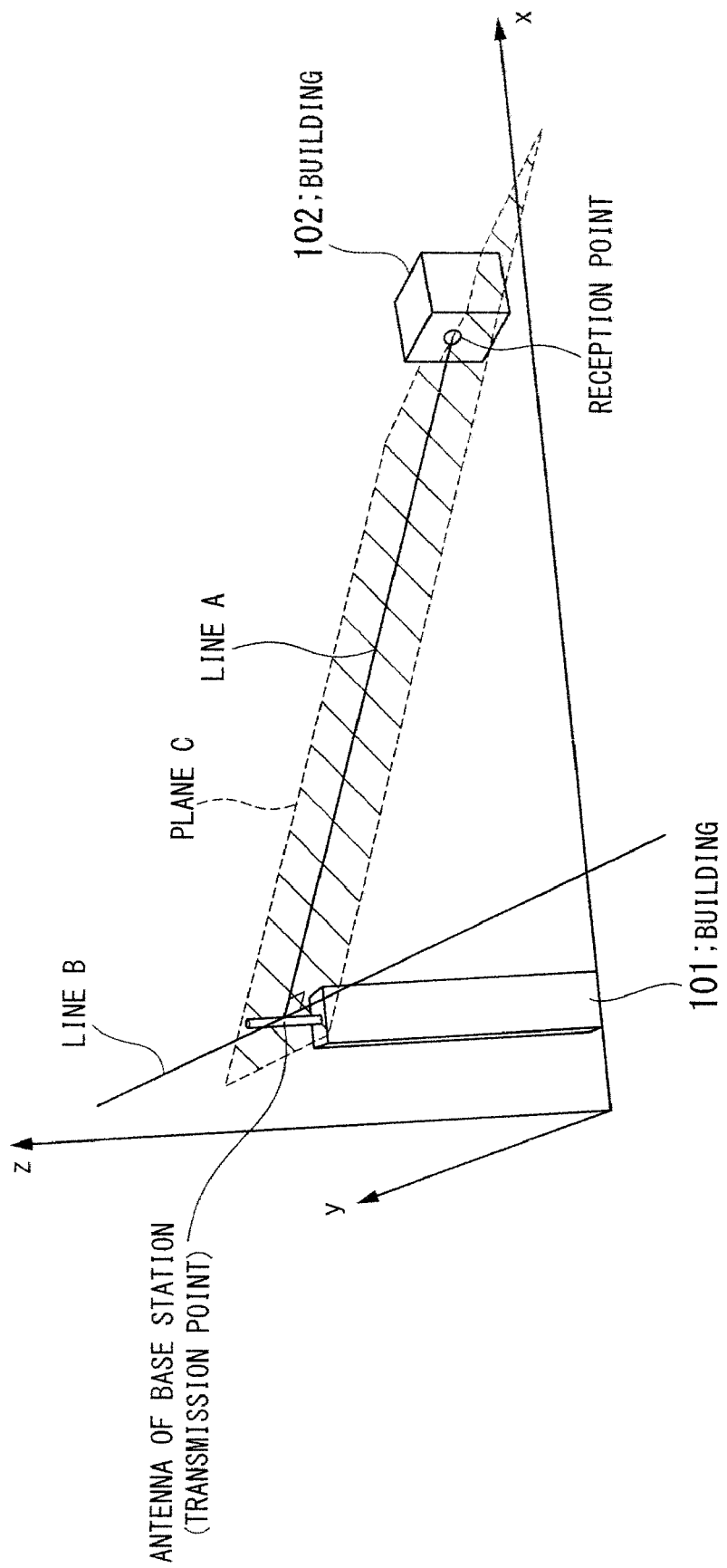
FIG. 4 is a conceptual diagram for explaining a plan view data generation method according to the embodiment of the present invention.

Here is a description of a plan view data generation method with reference to FIG. 4. FIG. 4 is a conceptual diagram for explaining a plan view data generation method according to the present embodiment.

In FIG. 4, the X axis and the Y axis are axes that are orthogonal to each other within a horizontal plane. The Z axis is a vertical axis. There is installed an antenna of a base station on a rooftop of the building 101. The antenna of the base station is a transmission point. The building 102 has a reception point. The heights of the transmission point and the reception point have been specified in step S1. If the height of the transmission point or the reception point has not been specified, a value according to a height of the building with the point (for example, half the height of the building) is regarded as a height of the point.

Figure 5:
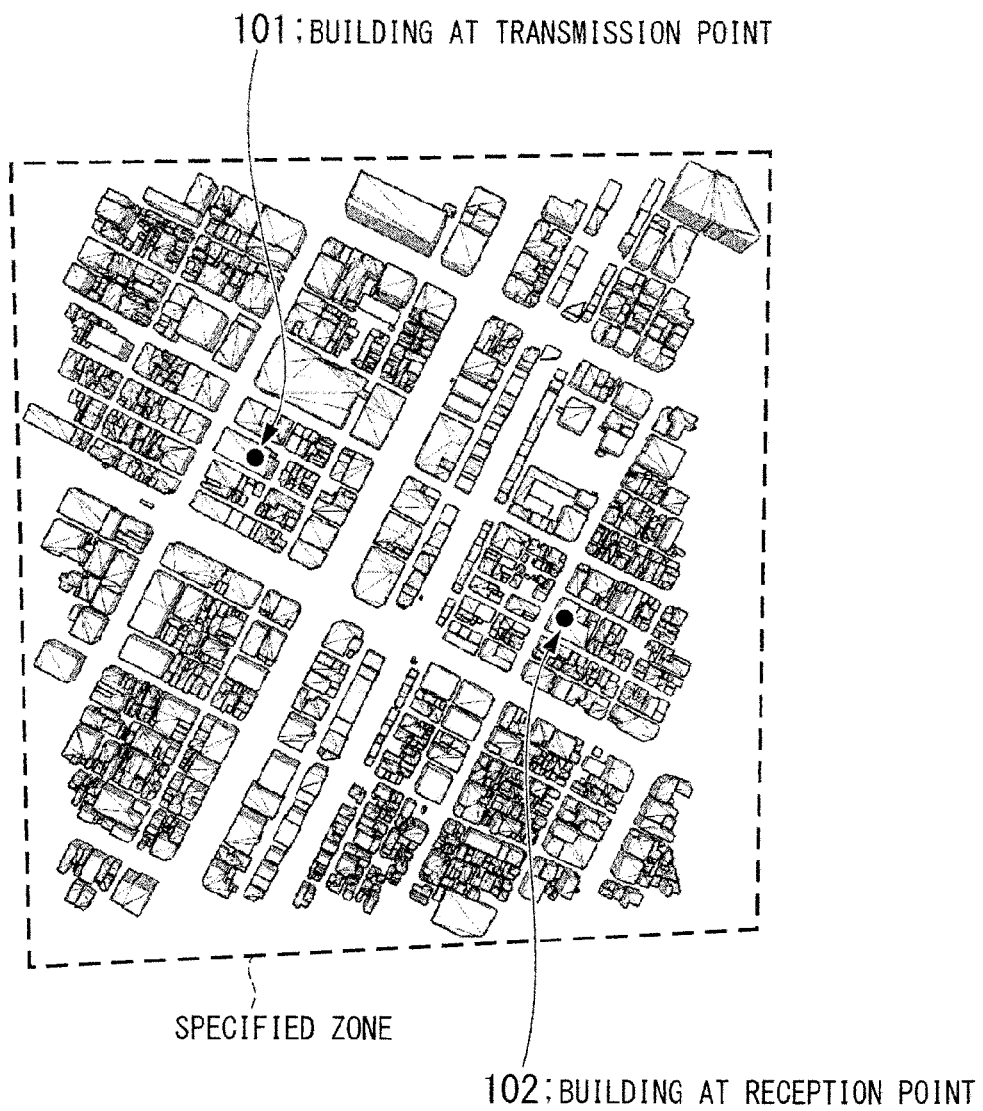
FIG. 5 is a conceptual diagram of plan view data according to the embodiment of the present invention.

A line A is a line (a first line) that connects the antenna of the base station (the transmission point) with the reception point. The line B is a horizontal line (a second line) orthogonal to the line A. The plane C is a plane that includes the line A and the line B. The plan view data generation section 4 generates data on cross-sections of the buildings taken along the plane C (plan view data). FIG. 5 shows a conceptual diagram of plan view data. As shown in FIG. 5, the plan view data shows a cross-sectional view of the buildings taken along the plane C in the specified zone.

Figure 6:
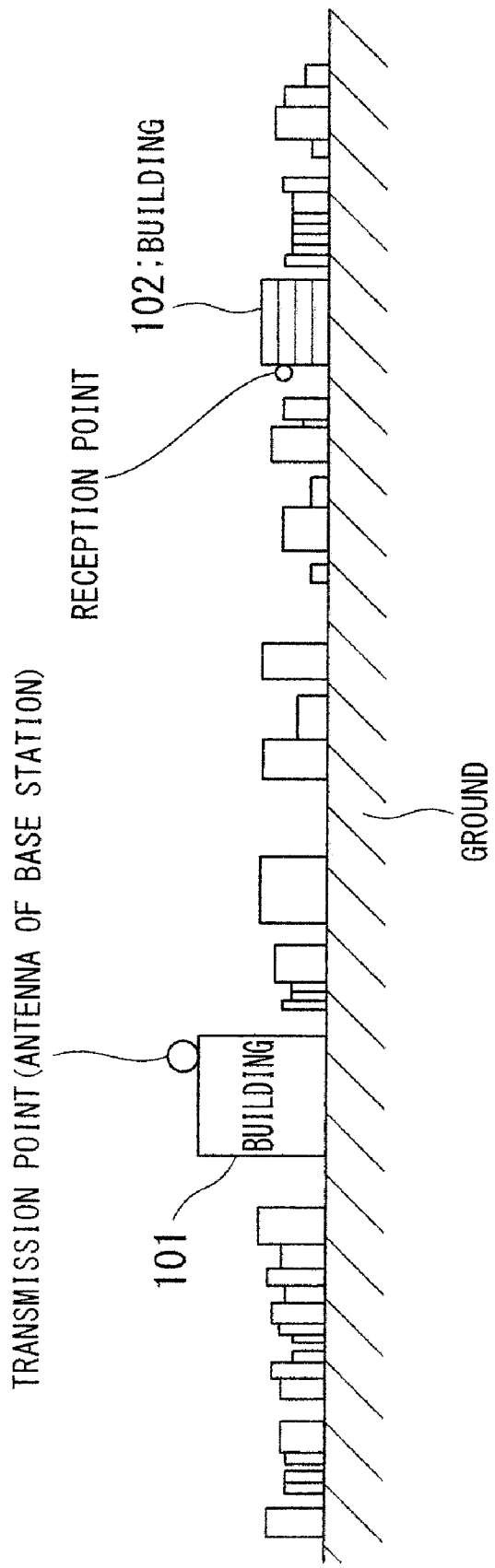
FIG. 6 is a conceptual diagram of vertical cross-sectional view data according to the embodiment of the present invention.

Next, in step S4, the vertical cross-sectional view data generation section 5 uses the information on the buildings in the specified zone to generate vertical cross-sectional view data on the buildings in the specified zone. The vertical a cross-sectional view data generation section 5 generates data on cross-sections of the buildings in the specified zone taken along a vertical plane including the line connecting the transmission point with the reception point (vertical cross-sectional view data). FIG. 6 shows a conceptual diagram of vertical cross-sectional view data. As shown in FIG. 6, the vertical cross-sectional view data shows a cross-sectional view of the buildings taken along the vertical plane including the line connecting the transmission point with the reception point in the specified zone.

Next, in step S5, the ray launching method calculation section 6 uses the plan view data to calculate the first piece of radio wave propagation characteristic estimation data in which the radio wave propagation characteristic from the transmission point to the building with the reception point has been estimated by the ray launching method. In this calculation processing of the first piece of radio wave propagation characteristic estimation data, the ray launching method is used in which launch directions of the radio waves from the transmission point are provided within the plane C for 360 degrees at every predetermined angle and the traces of the radio waves launched in the launch directions are checked. Then, for every trace of the radio waves to the building with the reception point (that is, every propagation route from the transmission point to the building with the reception point), a propagation loss of the radio wave from the transmission point to the building with the reception point or a received signal intensity in the building with the reception point is calculated based on the trace.

The propagation route with large propagation loss, hence with a low received signal intensity may be hereinafter eliminated from the processing targets. Threshold values (propagation loss or received signal intensity) for this determination are previously set.

Next, in step S6, the imaging method calculation section 7 uses the vertical cross-sectional view data to calculate the second piece of radio wave propagation characteristic estimation data in which the radio wave propagation characteristic from the transmission point to the building with the reception point has been estimated by the imaging method. In this calculation processing of the second piece of radio wave propagation characteristic estimation data, the imaging method is used in which reflection surfaces and diffraction points present between the transmission point and the building with the reception point are geometrically found and the traces of the radio waves from the transmission point to the building with the reception point are calculated. Then, for every trace of the radio waves to the building with the reception point (that is, every propagation route from the transmission point to the building with the reception point), a propagation loss of the radio wave from the transmission point to the building with the reception point or a received signal intensity in the building with the reception point is calculated based on the trace.

The propagation route with a large propagation loss, and hence with a low received signal intensity may be hereinafter eliminated from the processing targets. Threshold values (propagation loss or received signal intensity) for this determination is previously set.

Next, in step S7, the synthesis section 8 calculates pieces of indoor penetration data to the reception point within the building respectively for the first piece of radio wave propagation characteristic estimation data and the second piece of radio wave propagation characteristic estimation data, and synthesizes the pieces of indoor penetration data. In this synthesis processing, a propagation loss or a received signal intensity is synthesized.

Figure 7:
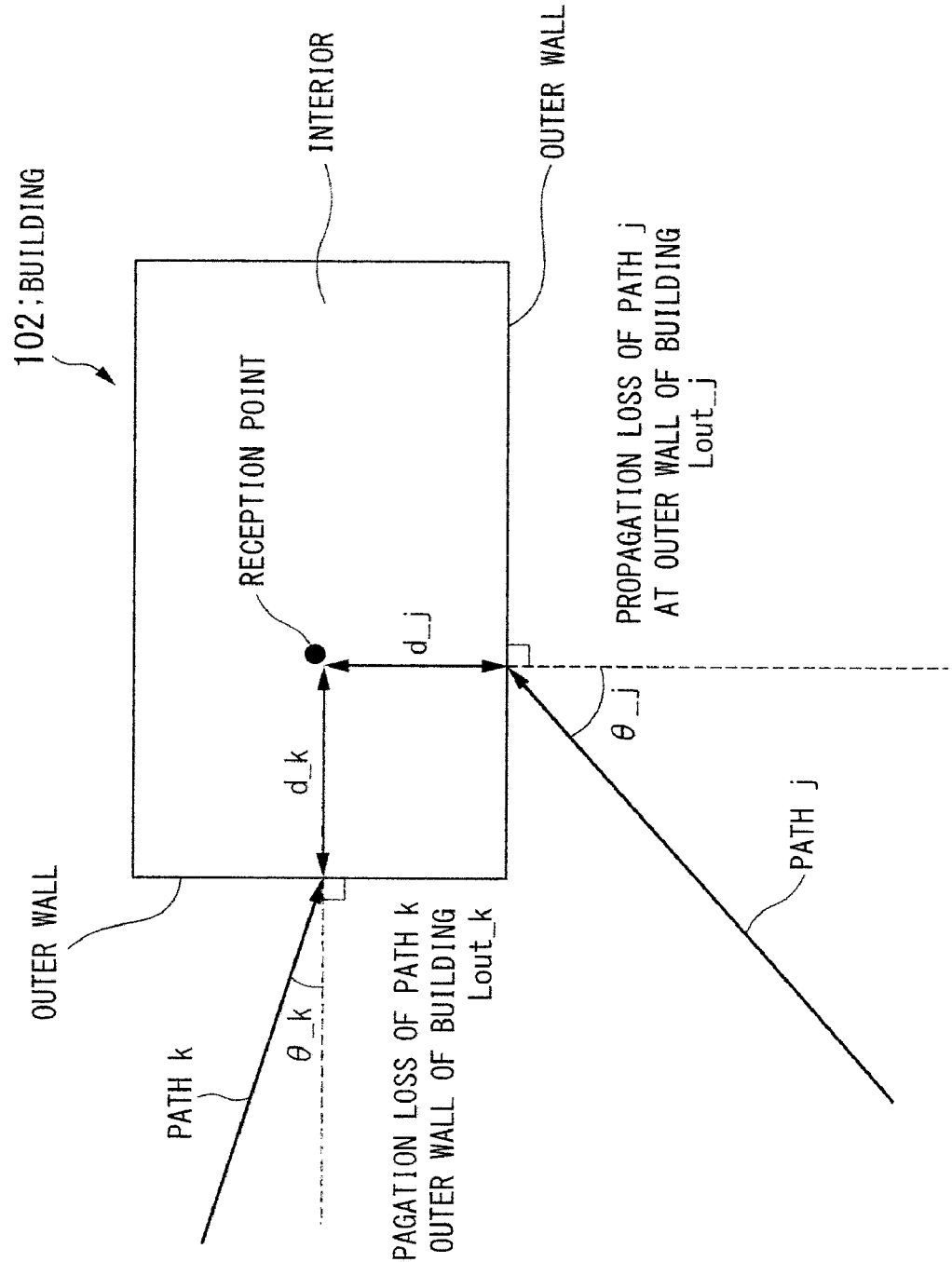
FIG. 7 is a conceptual diagram for explaining a method of calculating radio wave propagation characteristic estimation data at a reception point within a building, according to the embodiment of the present invention.

Here, the synthesis processing of radio wave propagation characteristic estimation data according to the present embodiment will be described with reference to FIG. 7.

First, the synthesis section 8 calculates pieces of indoor penetration data to the reception point within the building for the first piece of radio wave propagation characteristic estimation data and the second piece of radio wave propagation characteristic estimation data. In FIG. 7, the reception point is provided in the interior of the building 102. A propagation route (path) k and a propagation route (path) j reach the 102. At this time, indoor penetration data L_i on a propagation loss of the path i is calculated using formula (1). Indoor penetration data P_i on a received signal intensity of the path i can be similarly calculated using formula (1) with the replacement of the propagation loss with the received signal intensity.

$$L\_i = L_{OUT}\_i + \alpha \times d\_i \times \sin\theta\_i + \beta \text{(unit:decibel)} \tag{1}$$

where L_i is indoor penetration data on the propagation loss of the path i; $L_{OUT}\_i$ is a propagation loss of the path i at an outer wall of the building; α is a coefficient of an indoor distance characteristic (distance coefficient); d_i is a distance from the outer wall on which the radio wave of the path i is incident to the reception point (unit: meter); θ_i is an angle formed by an incoming direction of the path i and a normal from the outer wall surface (an incident angle); and β is an indoor penetration loss, which is dependent on the material of the surface on which the radio wave is incident. Note that "COST 231 Final Report, Chapter 4, pp. 167-174" disclosed that the distance coefficient α is favorably about 0.6. Furthermore, the incident angle θ_i is previously found as radio wave propagation characteristic estimation data by the ray launching method calculation section 6 and the imaging method calculation section 7.

Next, the synthesis section 8 synthesizes the pieces of indoor penetration data calculated from the first piece of radio wave propagation characteristic estimation data and the second piece of radio wave propagation characteristic estimation data. In the case of the propagation loss, a resultant value L of the indoor penetration data L_i of the propagation loss is calculated using formula (2). In the case of the received signal intensity, a resultant value P of the indoor penetration data P_i is calculated using formula (3).

[Formula 1]

$$L = 10\log_{10}\left(\sum_i 10^{-L\_i/10}\right) \text{ (unit: decibel)} \quad (2)$$

[Formula 2]

$$P = 10\log_{10}\left(\sum_i 10^{P\_i/10}\right) \text{ (unit: decibel)} \quad (3)$$

The description is made with reference back to FIG. 2.

Next, in step S8, the output section 9 outputs the radio wave propagation characteristic estimation data synthesized by the synthesis section 8 (the resultant value L of the propagation loss or the resultant value P of the received signal intensity).

As described above, in the present embodiment, the propagation route within the pane C is found by the ray launching method, and the propagation route within the vertical plane is found by the imaging method. The plane C is a plane that includes the line A (the first line) connecting the transmission point with the reception point and the horizontal line B (the second line) orthogonal to the line A (see FIG. 4). The reason for this will be described. This is based on the knowledge that within the plane C, a reflection of a radio wave off the outer wall of a building is a main trace of the radio wave. That is, within the plane C, the influence of a diffraction wave is less than that of a reflection wave. Therefore, with importance attached to a reduction in amount of calculations, the ray launching method is used. On the other hand, within the vertical plane, a multitude of traces of radio waves that repeat reflections and diffractions from roof to roof of the buildings. Hence, not only reflection waves but also diffraction waves are important. Therefore, the imaging method is used.

As a result, according to the present embodiment, with a proper combination of the ray launching method with the imaging method, an advantage is obtained in that it is possible to efficiently generate radio wave propagation characteristic estimation data.

Furthermore, pieces of indoor penetration data to the reception point within a building are calculated for the first piece of radio wave propagation characteristic estimation data and the second piece of radio wave propagation characteristic estimation data, and the pieces of indoor penetration data are synthesized, to thereby make it possible to find radio wave propagation characteristic estimation data at the reception point within the building.

Note that the plane C shown in the above FIG. 4 includes a horizontal plane. If the transmission point and the reception point are at the same height, the plane C is a horizontal plane. Or, if the height of the transmission point is not specified, the plane C may be a horizontal plane at the height of the reception point.

Figure 8:
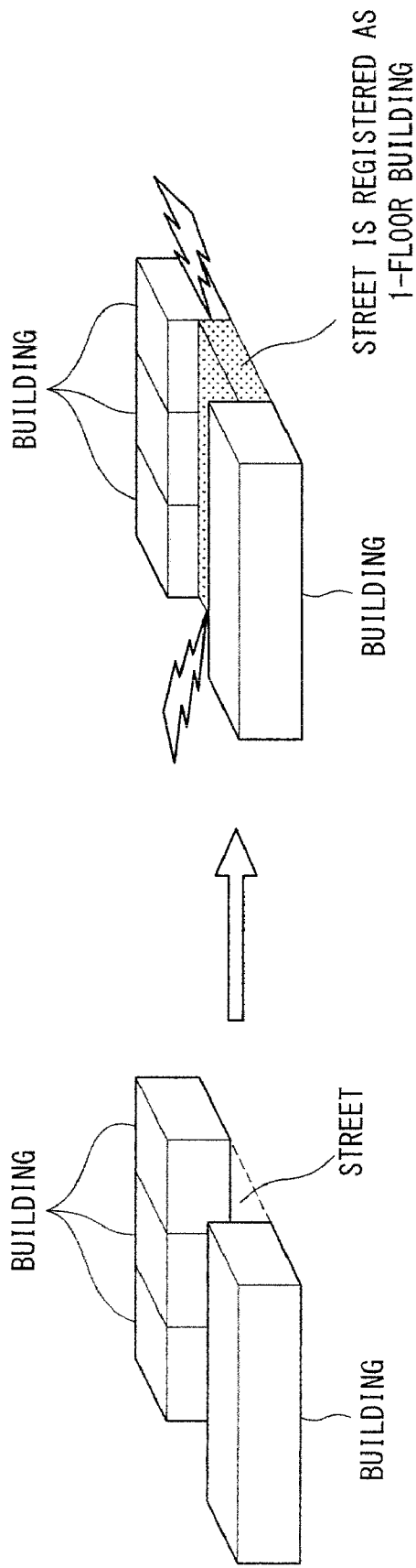
FIG. 8 is a conceptual diagram for explaining a method of treating a street as a propagation route of a radio wave, according to the embodiment of the present invention.
Figure 9:
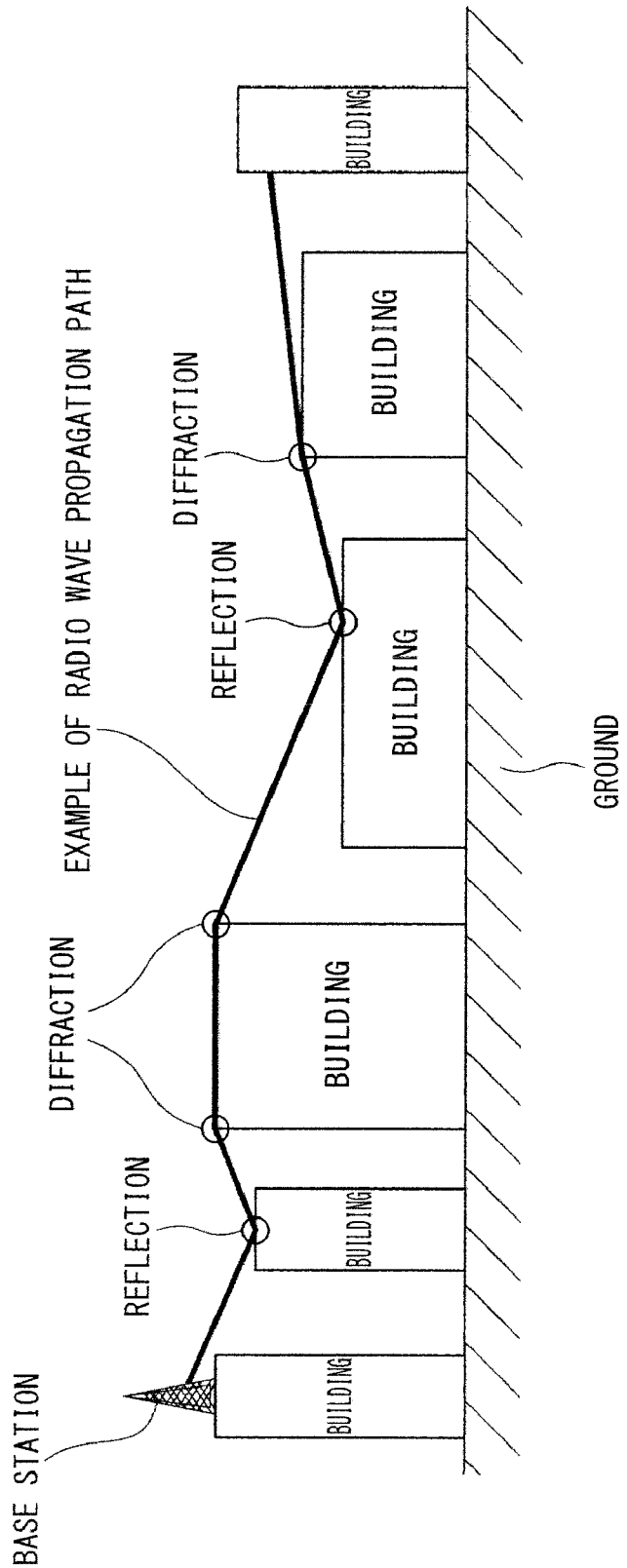
FIG. 9 is a conceptual diagram showing an example of a propagation route of a radio wave.

Next is a description of a method of treating a street as a propagation route of a radio wave with reference to FIG. 8.

As shown in FIG. 8, a radio wave can be conceived as coming to a street surrounded by buildings from an entrance to the street. Therefore, the street is registered with the building database 3 as a 1-floor building. An arcade installed across the street is also registered with the building database 3 as a 1-floor building. As a result, it is possible to treat and process streets and arcades also as buildings in a unified manner.

A program for implementing the steps shown in FIG. 2 may be stored in a computer-readable medium, and a computer system may be allowed to read and execute the program stored in this recording medium, to thereby perform the radio wave propagation characteristic estimation processing. Note that the "computer system" here may be one that includes OS and hardware such as peripheral equipment.

Furthermore, the "computer system" includes a home page providing environment (or display environment) in the case where a WWW system is utilized.

Moreover, a "computer-readable medium" refers to a flexible disk, an optical magnetic disk, ROM, a writable non-volatile memory such as a flash memory, and a portable medium such as a DVD (Digital Versatile Disk) as well as a storage device such as a hard disk built into a computer system.

Furthermore, a "computer-readable medium" includes any medium that temporarily holds a program such as a volatile memory (for example, DRAM (Dynamic Random Access Memory)) inside a computer system which functions as a server or a client when the program is sent via a network such as the Internet or via a communications line such as a telephone line.

Moreover, the above program may be transmitted from a computer system that has this program stored in a storage device to another computer system via a transmission medium or by transmission waves in a transmission medium. Here, the "transmission medium" that transmits the program refers to any medium with a function of transmitting information, which includes a network (a communications network) such as the Internet as well as a communications line (a communications wire) such as a telephone line.

Furthermore, the above program may be any program for implementing a part of the aforementioned functions.

Moreover, it may be any program that can be implemented in combination with a program already stored in a computer system, that is, a so-called differential file (a differential program).

While an embodiment of the present invention has been described in detail with reference to the drawings, these are not to be considered as limitative in terms of specific configurations. The present invention includes design modifications and the like in the range that does not depart from the spirit or scope of the invention.

According to the present invention, the ray launching method and the imaging method are properly combined. Thereby, an advantage is obtained in that radio wave propagation characteristic estimation data can be efficiently generated. Furthermore, another advantage is obtained in that a radio wave characteristic from an outdoor transmission point to an indoor reception point can be estimated.

What is claimed is:

1. A radio wave propagation characteristic estimation apparatus, which estimates a characteristic related to propagation of a radio wave from one radio wave transmission point to one radio wave reception point in a specified zone, comprising:

a building database which has information on shapes, heights, orientations, and locations of buildings;

a plan view data generation unit which generates plan view data on the buildings in the specified zone, using the information in the building database;

a vertical cross-sectional view data generation unit which generates vertical cross-sectional view data being data on cross-sections of the buildings in the specified zone taken along a vertical plane comprising a line that connects the radio wave transmission point with the radio wave reception point, using the information in the building database;

a ray launching method calculation unit which calculates by a ray launching method a first radio wave propagation characteristic estimation data from the radio wave transmission point to a building with the radio wave reception point is estimated, using the plan view data;

an imaging method calculation unit which calculates by an imaging method a second piece of radio wave propagation characteristic estimation data from the radio wave transmission point to the building with the radio wave reception point is estimated, using the vertical cross-sectional view data; and a synthesis unit which calculates indoor penetration data to the radio wave reception point within the building respectively for the first piece of radio wave propagation characteristic estimation data and the second piece of radio wave propagation characteristic estimation data, and synthesizes the pieces of indoor penetration data to produce the estimate of a characteristic related to propagation of a radio wave from one radio wave transmission point to one radio wave reception point in the specified zone.

2. The radio wave propagation characteristic estimation apparatus according to claim 1, wherein the plan view data is data on cross-sections of the buildings in the specified zone taken along a plane that comprises a first line connecting the radio wave transmission point having a height with the radio wave reception point having a height and a horizontal second line orthogonal to the first line.

3. The radio wave propagation characteristic estimation apparatus according to claim 1, wherein a street is registered with the building database as a 1-floor building.

4. A non-transitory computer-readable recording medium storing a computer program for estimating a characteristic related to propagation of a radio wave from one radio wave transmission point to one radio wave reception point in a specified zone, when executed by a computer, the program causes the computer to execute:

a reading process which reads information on buildings in the specified zone from a building database which has information on shapes, heights, orientations, and locations of buildings;

a plan view data generation process which generates plan view data on the buildings in the specified zone, using the information on the buildings in the specified zone;

a vertical cross-sectional view data generation process which generates vertical cross-sectional view data being data on cross-sections of the buildings in the specified zone taken along a vertical plane comprising a line that connects the radio wave transmission point with the radio wave reception point, using the information on the buildings in the specified zone;

a ray launching method calculation process which calculates by a ray launching method a first radio wave propagation characteristic estimation data from the radio wave transmission point to a building with the radio wave reception point using the plan view data;

an imaging method calculation process which calculates by an imaging method a second radio wave propagation characteristic estimation data from the radio wave transmission point to the building with the radio wave reception point using the vertical cross-sectional view data; and a synthesis process which calculates indoor penetration data to the radio wave reception point within the building respectively for the first radio wave propagation characteristic estimation data and the second radio wave propagation characteristic estimation data, and synthesizes the indoor penetration data to produce the estimate of a characteristic related to propagation of a radio wave from one radio wave transmission point to one radio wave reception point in the specified zone.

5. The computer-readable recording medium according to claim 4, wherein the plan view data is data on cross-sections of the buildings in the specified zone taken along a plane that comprises a first line connecting the radio wave transmission point having a height with the radio wave reception point having a height and a horizontal second line orthogonal to the first line.

6. The radio wave propagation characteristic estimation apparatus according to claim 2, wherein a street is registered with the building database as a 1-floor building.

* * * * *